United States Patent [19]
Vavrek et al.

[11] Patent Number: 5,304,933
[45] Date of Patent: Apr. 19, 1994

[54] SURGICAL LOCAL GRADIENT COIL

[75] Inventors: Robert M. Vavrek, Waukesha; Christopher C. Myers, Milwaukee, both of Wis.

[73] Assignee: General Electric Company, Milwaukee, Wis.

[21] Appl. No.: 738,970

[22] Filed: Aug. 1, 1991

[51] Int. Cl.$^5$ ............................................. G01R 33/20
[52] U.S. Cl. .................................... 324/318; 324/300
[58] Field of Search ............... 324/318–322, 324/300; 128/653.2, 653.5; 335/297, 298, 299, 301, 300

[56] References Cited

U.S. PATENT DOCUMENTS

| | | | |
|---|---|---|---|
| 4,425,547 | 1/1984 | Sugimoto | 324/318 |
| 4,727,328 | 2/1988 | Carper et al. | 324/318 |
| 4,840,700 | 6/1989 | Edelstein et al. | 156/634 |
| 4,920,316 | 4/1990 | Eyloff | 324/318 |
| 5,084,676 | 1/1992 | Saho et al. | 324/318 |
| 5,185,576 | 2/1993 | Vavrek et al. | 324/318 |

OTHER PUBLICATIONS

Gradient Coil Design For Patient Access by Myers et al., Aug. 10–16, 1991.

*Primary Examiner*—Michael J. Tokar
*Assistant Examiner*—Raymond Y. Mah
*Attorney, Agent, or Firm*—Quarles & Brady

[57] ABSTRACT

A local gradient coil adapted for use with stereotaxic devices includes an opening in the coil form positioned to minimize the disruption to the gradient fields and a bearing for moving the form with respect to the stereotaxic frame so that the opening may be limited in area and yet provide essentially unrestricted access to the patient. The windings in the neighborhood of the opening may be diverted by modifying the stream function of the windings in a manner to minimize the effect of the opening on the gradient field.

4 Claims, 5 Drawing Sheets

SURGICAL LOCAL GRADIENT COIL

BACKGROUND OF THE INVENTION

1. Filed of the Invention

The field of the invention is magnetic resonance imaging (MRI) and, in particular, gradient coils for use with MRI systems.

2. Background Art

Magnetic Resonance Imaging

In MRI, a uniform polarizing magnetic field $B_0$ is applied to an imaged object along the z-axis of a Cartesian coordinate system, the origin of which is approximately centered within the imaged object. The effect of the magnetic field $B_0$ is to align the object's nuclear spins along the z-axis.

In response to a radio frequency (RF) excitation signal of the proper frequency, oriented within the x-y plane, the nuclei precess about the z-axis at their Larmor frequencies according to the following equation:

$$F = \gamma B_0 \tag{1}$$

where F is the Larmor frequency, and $\gamma$ is the gyromagnetic ratio which is constant and a property of the particular nuclei.

Water, because of its relative abundance in biological tissue and the properties of its nuclei, is of principle concern in such imaging. The value of the gyromagnetic ratio $\gamma$ for water is 4.26 kHz/gauss and therefore, in a 1.5 Tesla polarizing magnetic field $B_0$, the resonant or Larmor frequency of water is approximately 63.9 MHz.

In a typical imaging sequence, the RF excitation signal is centered at the Larmor frequency F and applied to the imaged object at the same time as a magnetic field gradient $G_z$ is applied. The gradient $G_z$ varies the strength of the magnetic field $B_0$ along the z-axis and, therefore, causes only the nuclei in a single slice through the object along an x-y plane to have the resonant frequency F and to be excited into resonance.

After the excitation of the nuclei in this slice, similar magnetic field gradients are applied along the x and y axes. The gradient along the x-axis, $G_x$, causes the nuclei to precess at different frequencies, depending on their position along the x-axis, that is, $G_x$ spatially encodes the precessing nuclei by frequency. The y-axis gradient, $G_y$, is incremented through a series of values and encodes y position into the rate of change of phase of the precessing nuclei as a function of gradient amplitude, a process typically referred to as phase encoding. It is desirable that the gradients $G_x$, $G_y$, and $G_z$, be extremely linear within the imaging area of the bore 12 to prevent spatial distortion of the resulting MRI image.

A weak nuclear magnetic resonance generated by the precessing nuclei may be sensed by the RF antenna "coil" and recorded as an NMR signal. Typically, the NMR signal is detected along two perpendicular axes to produce a quadrature signal having a real and an "imaginary" part. From this quadrature NMR signal, a slice image may be derived according to well-known reconstruction techniques. A basic overview MRI image reconstruction is contained in the book "Magnetic Resonance Imaging, Principles and Applications" by D. N. Kean and M. A. Smith.

Stereotaxic Surgery

In stereotaxic surgery a delicate instrument, such as a hollow needle, is maneuvered in three planes, to direct its tip to a predetermined location within a body of tissue of the nervous system. This techniques is particularly valuable in the treatment of tumors of the brain. In this latter case, the stereotaxic instrument is a hollow needle which is directed to the site of the tumor. An optical guide is threaded into the needle and intense laser light is directed through the guide to destroy the tumorous material.

During the procedure of positioning the needle and of destroying the tumor, it is desirable to monitor location of the needle and the temperature of both the tumorous material and the surrounding healthy brain tissue. Such monitoring ensures both the correct placement of the needle and that the tumor is heated to destroy it without damaging the surrounding tissue. This monitoring must be on a real time basis, that is, the physician should have a nearly instantaneous view of the needle position and the tissue temperatures.

MRI can be used to measure the temperature of tissue through well known diffusion weighted pulse sequences. Further, MRI excels in imaging soft tissue such as the brain and therefore would seem to be well suited to monitoring the temperature of the brain tissue and the location of the tumor and the stereotaxic probe. Unfortunately, the delay intrinsic in the scanning time required for conventional MRI imaging, sharply limits the application of such equipment to stereotaxic procedures.

Local Gradient Coils

MRI scanning time can be shortened through the use of faster and stronger local gradient coils. U.S. Pat. No. 5,185,576 entitled: "Local Gradient Coil" and patented Feb. 9, 1993 describes a local gradient coil having a substantially smaller radius than the standard gradient coils positioned on the bore tube of the MRI machine. The local gradient coil exploits the fact that gradient strength, for a given number of ampere-turns, increases to the fifth power with a given decrease in coil radius. Some of the gradient strength can be traded off for lower inductance and lower inductance permits faster gradient speed at a given level of gradient voltage. Therefore, the local gradient coil provides increased gradient speed and strength, without appreciably increasing the gradient power applied to the gradient coil.

A local gradient coil would seem to be the answer to the problem of monitoring stereotaxic procedures with MRI because it allows the generation of nearly real time images using rapid MRI techniques such as "echo planar imaging". Unfortunately, the reduced size of the local gradient coil significantly interferes with access to the patient for the insertion of the stereotaxic device. Increasing the size of the local gradient coil to permit such access eliminates much of the advantage of using a local gradient coil.

SUMMARY OF THE INVENTION

The present invention is a local gradient coil assembly suitable for use in stereotaxic procedures. A system of ports carefully placed in the gradient coil and a flexible mounting system provide good access to the patient without enlarging the local gradient coil or unduly disrupting the critical linearity of the gradient fields.

Specifically, a coil form of a local coil includes a port. A gradient coil, having windings attached to the coil form also has a port aligning with the port of the coil form. Together, the ports allow the insertion of a stereotaxic device. An alignment device having a locked and unlocked state holds the patient fixed with respect to the coil form when locked, and allows the coil form to move, on a bearing with respect to the patient, when unlocked.

It is one object of the invention to allow a local gradient coil, to be used in stereotaxic procedures, and yet to limit interference between the local coil's structure and the stereotaxic instruments, and to prevent unacceptable distortion of the gradient fields. The bearing on the gradient coil form permits a single small port or a small number of small ports to move and to provide unrestricted access to the patient. The gradient coil may be designed so as to limit distortion of the gradient fields caused by the ports.

The bearing may permit the coil form and the gradient coils to be rotated about an axis with an encoder providing an angle signal indicative of the rotation of the coil form. This angle signal may be used to modify the gradient signals to the gradient coil so as to compensate for rotation of the coil form as it may affect the MRI images.

Thus, it is another object of the invention to prevent rotation of the gradient coils from rotating the image produced by the MRI system.

The windings of the gradient coil on the coil form may be diverted about the ports so as to minimize the distortion of the gradient field caused by the ports. The diversion of the windings may be performed by "feathering" the constant stream function $S_0$ within the port to the unaffected stream function $S_{coil}$ about the port in a transition region and using this feathered stream function to recompute the winding positions for the gradient coils.

It is another object of the invention, then, to reduce the distortion of the gradient coil caused by the introduction of ports of arbitrary size placed in the gradient coil. Such ports may be for positioning stereotaxic devices or for other access purposes.

The foregoing and other objects and advantages of the invention will appear from the following description. In the description, reference is made to the accompanying drawings which form a part hereof and in which there is shown by way of illustration, several preferred embodiments of the invention. Such embodiments do not necessarily represent the full scope of the invention, however, and reference must be made therefore to the claims herein for interpreting the scope of the invention.

DETAILED DESCRIPTION OF THE PREFERRED EMBODIMENT

MRI magnet assembly

Figure 1:
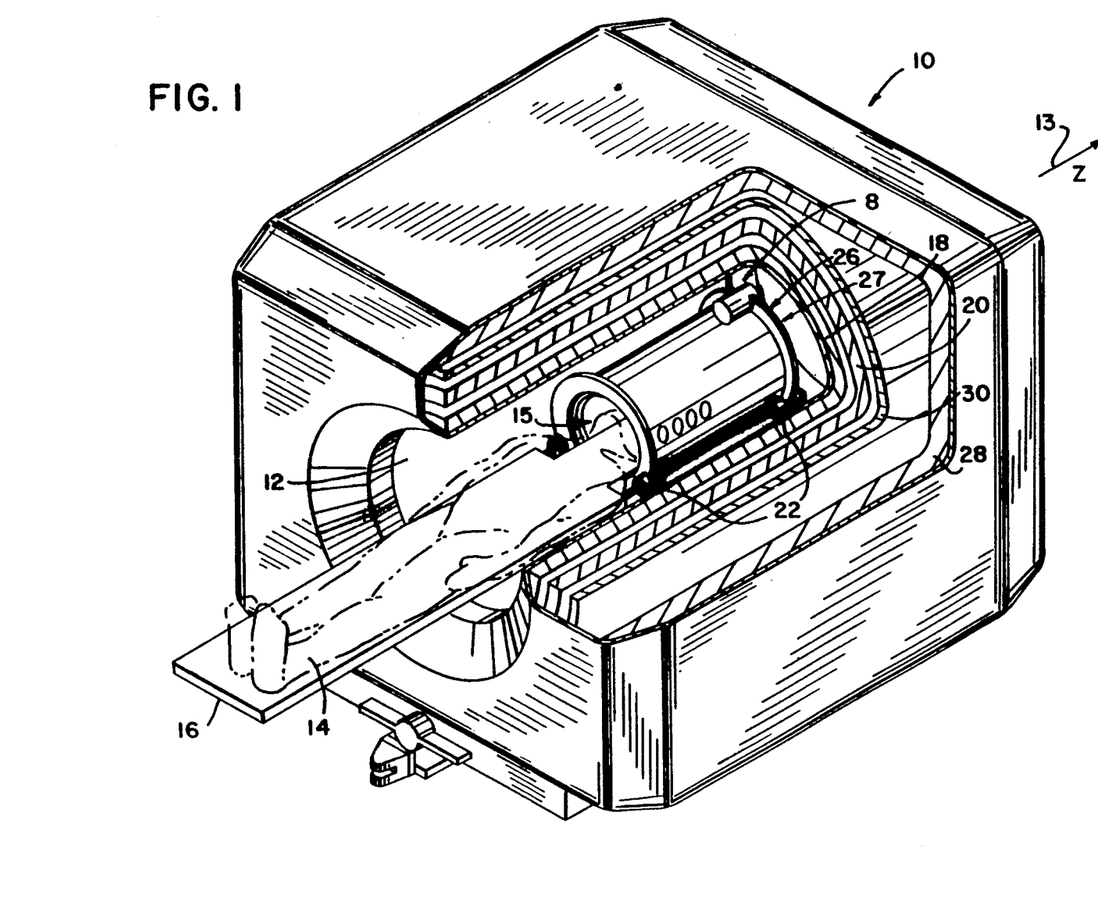
FIG. 1 is a perspective, cut-away view of an MRI magnet showing the placement of the polarizing coils, the gradient coils, and the RF coils on the bore tube and showing the placement of the local gradient coil of the present invention about the head of the patient.

Referring to FIG. 1, an MRI magnet assembly 10 has a cylindrical bore tube 12 extending along a z-axis 13 for receiving a supine patient 14 supported on an RF transparent table 16. The table 16 may move in and out of the bore tube 12 so as to position the patient 14 along the z-axis 13 within the volume of the bore tube 12.

Coaxially surrounding the bore tube 12 is a whole body RF coil 18 for exciting the spins of the patient 14 into resonance, as has been described. Whole body gradient coils 20 surround both the bore tube 12 and the whole body RF coil 18 and are also co-axial with the z-axis 13, to provide x, y, and z gradient fields $G_x$, $G_y$ and $G_z$ as required for MRI imaging. The whole body gradient coils 20 are driven by gradient amplifiers (not shown).

The polarizing magnetic field $B_0$, aligned with the z-axis 13, is generated by a superconducting magnet coil 28 coaxial with but outside the bore tube 12, the whole body RF coil 18, and the gradient coils 20. The superconducting magnet coil 28 has no external power supply but operates on an initial current which continues unabated in the zero resistivity windings of the superconducting magnet coil 28.

Interposed between the superconducting magnet coil 28 and the whole body gradient coils 20 is a set of shim coils 30 which are used to correct the homogeneity of the polarizing field $B_0$ as is understood in the art. A set of mechanical linkages and insulators (not shown) rigidly connect each of these coils 18, 20, 28 and 30 together to the bore tube 12 so as to resist such relative motions therebetween as may be generated by the interaction of their various electromagnetic fields.

A local coil assembly 8 in the form of a cylindrical tube is sized to be received within the bore tube 12 on the table 16. The inside diameter of the bore tube 12 is approximately twenty-two inches whereas the inside diameter of the local coil assembly 8 is approximately eleven inches. Thus the internal volume of the local coil assembly 8 more nearly approaches the volume of the patient's head 15.

The local gradient coil assembly 8 includes a set of local gradient coils 26, duplicating the function of the whole body gradient coils 20, and a local RF coil 27 duplicating the function of the whole body RF coil 18. When the local gradient coil assembly 8 is in use, the whole body gradient coils 20 and the whole body RF coil 18 on the bore tube 12 are deactivated.

The local coil assembly 8 is not directly attached to the bore tube 12 but rather is attached to the table 16 through a positioning mechanism 22 to be described in detail below. Generally, the local coil assembly 8 may be moved along the z-axis 13 with respect to the patient 14 and may be rotated about the z-axis 13 with respect to the patient 14.

The table 16 also may be moved along the z-axis 13 to position both the local coil assembly 8 and the patient 14 at the center of the bore tube 12, generally the position of greatest field homogeneity for the polarizing magnetic field $B_0$.

MRI System

Figures 2, 6A, 6B:
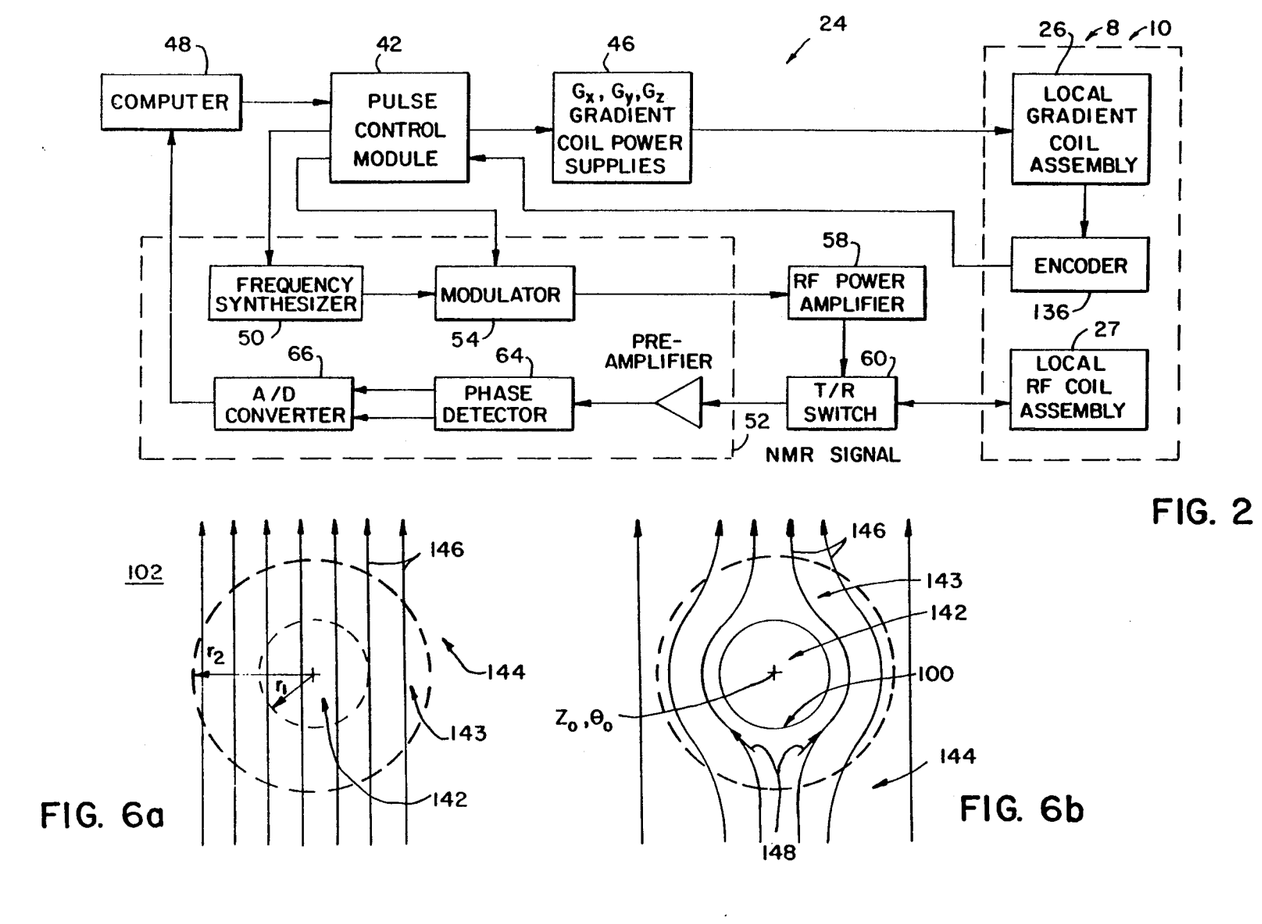
FIG. 2 is a block diagram of an NMR system incorporating a computer and suitable for use with the present invention.
FIGS. 6(a) and 6(b) are schematic representations of the ports in the gradient coils showing the variables of the calculation of the required change in the current density J in the neighborhood of the ports.
Figure 3A:
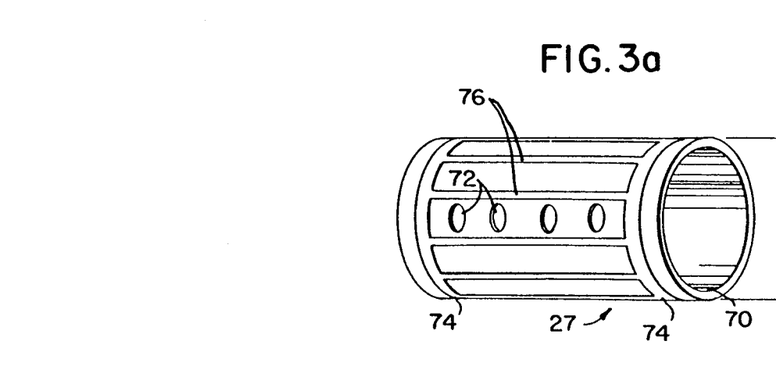
FIGS. 3a–d is an exploded view of the local coil assembly showing the RF coil and the three gradient coils and the positioning of an RF shield.
Figure 3B:
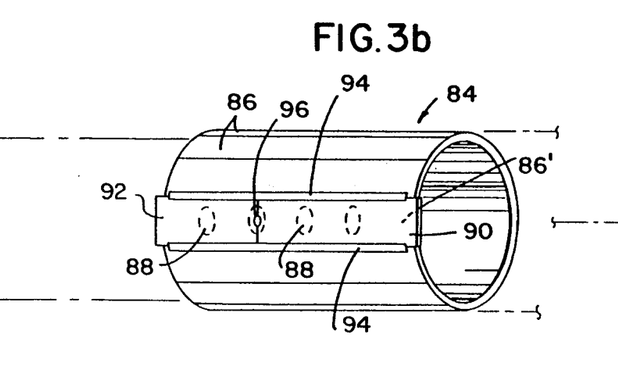
Figure 3C:
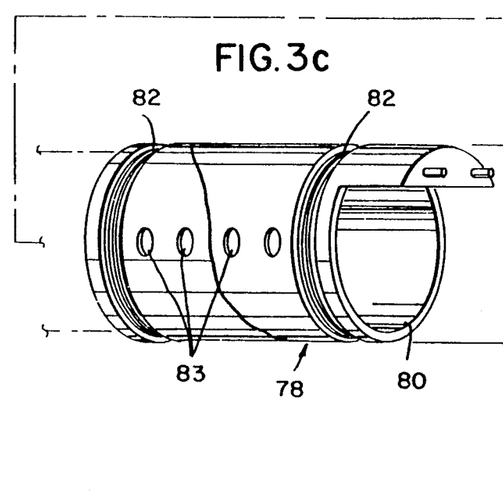
Figure 3D:
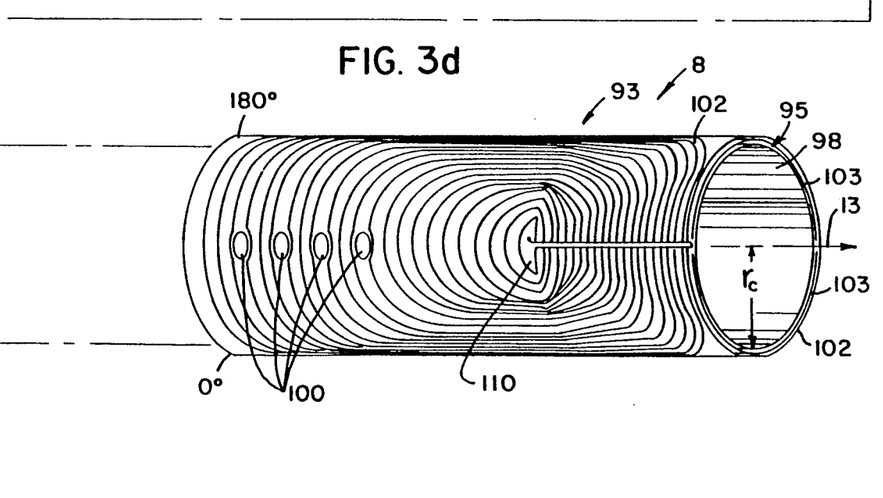

Referring to FIG. 2, an MRI system 24 incorporating the MRI magnet assembly 10, includes a pulse control module 42 which provides properly timed pulse sequences of RF pulses and which controls gradient power supplies 46 which produce the gradients $G_x$, $G_y$, and $G_z$. The gradient power supplies 46 are connected to the local gradient coils 26 rather than the whole body gradient coils 20 to provide faster MRI imaging as has been described.

The pulse control module 42 generates the pulse waveforms by digital synthesis techniques according to methods well known in the art, and hence, as controlled by computer 48, may effectively rotate the coordinates of the gradient fields experienced by the patient 14 from the axes dictated by the geometry of the local gradient coils 26, through a mathematical transformation requiring the simultaneous activation of more than one of the gradients $G_x$, $G_y$, and $G_z$ with reduced amplitudes, as will be described below.

The pulse control module 42 also controls a radio frequency synthesizer 50 which is part of an RF transceiver system, portions of which are enclosed by dashed line block 52. The pulse control module 42 also controls a RF modulator 54 which modulates the output of the radio frequency synthesizer 50. The resultant RF signals, amplified by power amplifier 58 and applied to local RF coil 27 through transmit/receive switch 60, are used to excite the nuclear spins of the imaged patient 14 (not shown in FIG. 2).

The NMR signals from the excited nuclei of the patient 14 are picked up by the local RF coil 27 and presented to preamplifier 62 through transmit/receive switch 60, to be amplified and then processed by a quadrature phase detector 64. The detected signals are digitized by high speed A/D converter 66 and applied to computer 48 for processing to produce NMR images of the object.

Local Gradient Coil Assembly

Referring to FIG. 3, the local gradient coil assembly 8 is comprised of four tubular elements of progressively increasing radius, each element fitting coaxially within the next element around the z-axis 13.

The first element, having the smallest diameter, is the local RF coil 27. The local RF coil 27 is constructed on a first tubular form 70 perforated on its surface along a line parallel to its axis, by four equally spaced access ports 72. Two conductive end-loops 74 pass circumferentially around opposite ends of the tubular form 70. Each loop 74 is interconnected by a series of conductive segments 76 directed axially and spaced equally around the circumference of the form 70. The local RF coil 27 transmits a rotating RF vector used to excite the nuclear spins of the patient 14 during the imaging process and receives the NMR signal as is generally understood in the art. Coils suitable for use in this application are taught in U.S. Pat. Nos. 4,694,255; 4,692,705; and 4,608,548 assigned to the assignee of the present invention and incorporated by reference. The end-loops 74 and segments 76 are constructed of metal foil taped to the outside of the first tubular form 70.

The next element is a z-axis gradient assembly 78 constructed on a second tubular form 80 sized to fit coaxially over the first tubular form 70. A second set of four access ports 82 are cut axially in the second tubular form 80 so as to align with access ports 72 in the first tubular form 70 when the second tubular form 80 is in position around the first tubular form 70.

A Maxwell pair of coils 82 are wound on opposite ends of the second tubular form 80 and interconnected to provide a gradient field along the axis of tubes 70 and 80, being the z-axis gradient $G_z$, when the axes of the tubes 70 and 80 are aligned with the z-axis 13. A description of a z-axis gradient assembly 78 suitable for use in the present invention is taught in the co-pending application referred to above, however it will be understood that other well known gradient coils designs may be employed.

The next element is a tubular RF shield 84 which fits between the first tubular form 70 and the second tubular form 80 to prevent interaction between the RF coil 27 and the z-axis gradient 84 and other gradients to be described. The RF shield 84 is comprised of a series of axial, conductive strips 86 which form the wall of a cylindrical tube fitting around the local RF coil 27. One strip 86' contains a series of ports 88 aligned with access ports 72 in the local RF coil 27 and the access ports 83 in the z-axis gradient 84.

Conductive shutters 90 and 92 are retained by guides 94 along the top of axial strip 86' to cover all but one of the ports 88. Shutters 90 and 92 may slide axially toward each other along the guides 94, meeting over the one uncovered port 88, to form an opening 96 at their junction. The opening 96 has a smaller diameter than the ports 88 but opens, by the sliding back of shutters 90 and 92, to completely expose port 88 as may be required.

The strips 86 and the shutters 92 are connected together at each rim of the tube which they form, but are separated by gaps along their length to reduce eddy currents induced by the gradient fields as is understood in the art.

The final elements of the local coil assembly are the x and y gradient coils 93 and 95 formed about a third tubular form 98, the tubular form 98 being sized to fit over the second tubular form 80 and having ports 100 corresponding in size and placement to the ports 83 and 72 in the second and first tubular forms 80 and 70, respectively.

Figure 5:
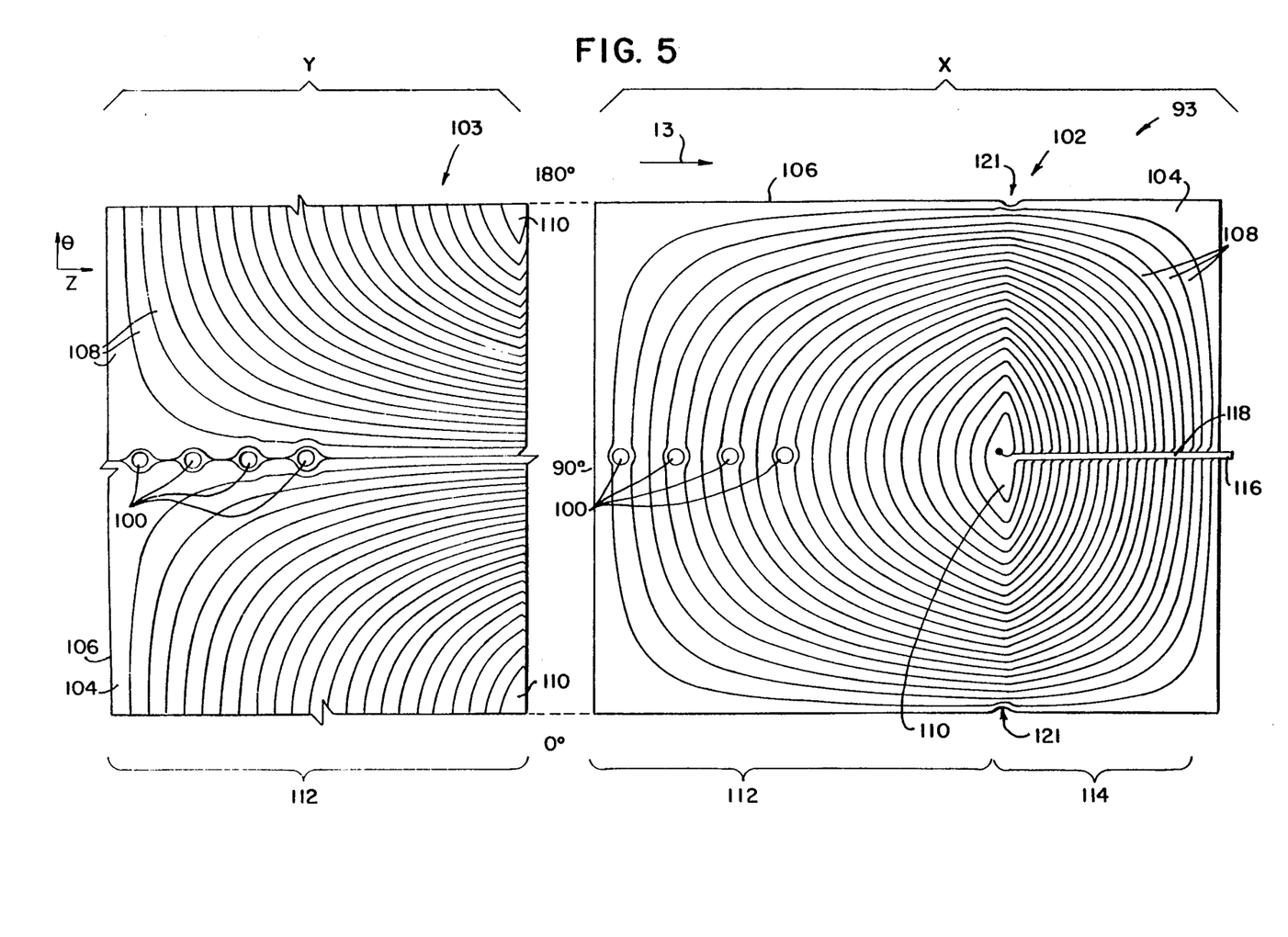
FIG. 5 is a panoramic or "unrolled" view of two layers of the etched pattern of a spiral coil used in the local coil assembly of FIG. 3 displaced to show the relative positioning of the ports in the gradient coil patterns.

Referring also to FIG. 5, the x-gradient coil 93 is constructed of a spiral coil 102 produced by selectively etching a copper cladding 104 laminated to the surface of a fiberglass epoxy sheet 106. The etching creates concentric loops 108 of a spiral about a center 110, the loops 108 of which form the windings of the spiral coil 102. Two such spiral coils 102 opposed on the third tubular form 98 make the x-gradient coil 93, each spiral coil 102 covering an area having a length equal to the z-axis length of the third tubular form 98 and a height equal to one-half the circumference of the third tubular form 98. Thus, each spiral coil 102 covers half the third tubular form 98, one from 0° to 180° and the second from 180° to 360°.

The first spiral coil 102 is wrapped around the outer surface of the third tubular form 98 as bisected by a vertical plane along the z-axis 13. The second spiral coil 102, having mirror symmetry with the first spiral coil 102, covers the remaining half the third tubular form 98.

A third and fourth spiral coils 103, displaced 90° around the z-axis 13 on the surface of the third tubular form 98, and positioned beneath the first set of spiral coils 102 form the y-axis gradient coil 95. One spiral coil 103 covers the top half of the third tubular form 98 and the other spiral coil 103 covers the bottom half of the tubular form 98.

The ports 100 in the third tubular form 98 continue through both the spiral coil 102 and 103, cutting through the loops 108 the first spiral coils 102 along the x-plane dividing the third tubular form 98 in half. Corresponding ports 100 are formed in the loops 108 of the two spiral coils 103 positioned beneath the spiral coils 102.

The loops 108 of the spiral coils 102 and 103 are diverted about the ports 100 in a manner so as to minimize the effect of the ports 100 on the gradient fields $G_x$ and $G_y$ generated by the spiral coils 102 and 103. The method of calculating the path of these loops 108 about the holes 100 will be described in detail further below.

The third tubular form 98 is positioned over the z-axis gradient assembly 78 such that the center 110 of each spiral coil 102 and 103 is aligned with the superior edge of the second tubular form 80 of the z-axis gradient assembly 78.

Spiral coils 102 and 103 are asymmetrical along the z-axis with the spacing between adjacent loops 108 wider over the z-axis gradient assembly 78, in an expanded section 112, and narrower beyond the z-axis gradient assembly 78, in a compressed section 114 on that portion of the third tubular form 98 not over the z-axis gradient assembly 78.

One end of a conductor 116 is attached to the outermost loop 108 of the spiral coil 102 and one end of a second, insulated conductor 118 is attached to the loop 108 at the center 110 of the spiral coil 102 to provide a current path through the spiral coil 102. The path of the insulated conductor 118 over the spiral coil 102 is away from the center 110 over the compressed section 114 parallel to the z-axis 13. The loops 108 of the spiral coil 102 beneath the insulated conductor 118 are canted at approximately 45° from their path (otherwise generally perpendicular to the insulated conductor 118) to minimize the effect of the flux generated by the current flow in the insulated conductor 118 on the gradient field. Similar conductors connect the other spiral coil 102.

Conductors corresponding to 116 and 118 connect to the centers 110 of the spiral coils 103 beneath the spiral coils 102. The centers 110 of the spiral coils 103 are reached through ports formed by notches 121 cut in the edges of the spiral coils 102 between the expanded and compressed sections 112 and 114 at the edges of the spiral coils 102. The loops 108 near these notches 121 are diverted around the notches 121 in a manner similar to the diversion of the loops 108 about the ports 100 as previously described and as will be discussed further in detail below.

The magnetic field from the current flowing through loops 108 of the expanded section 112 of the spiral coil 102, produces a gradient along the x-axis parallel to a line between centers 110 of spiral coils 102, and the return current from the loops 108 in the narrow section 114 is displaced from the patient 14 so as not to affect this gradient. Correspondingly, the magnetic field from the loops 108 of the expanded section 112 of the spiral coils 103 produces a gradient along the y-axis parallel to a line between centers 110 of spiral coils 103. Thus, the Maxwell pair 82 of the z-axis gradient assembly 78 and the spiral coils 102 and 103 of the x and y gradient coils 93 and 95 provide a complete x, y and z gradient for the volume enclosed in the RF coil 27. It will be understood that the exact order of the gradient coils 82, 103 and 102 on the second and third tubular forms 80 and 98 is subject to variation and that other orders are also acceptable

Positioning Mechanism and Stereotaxic Frame

Figure 4:
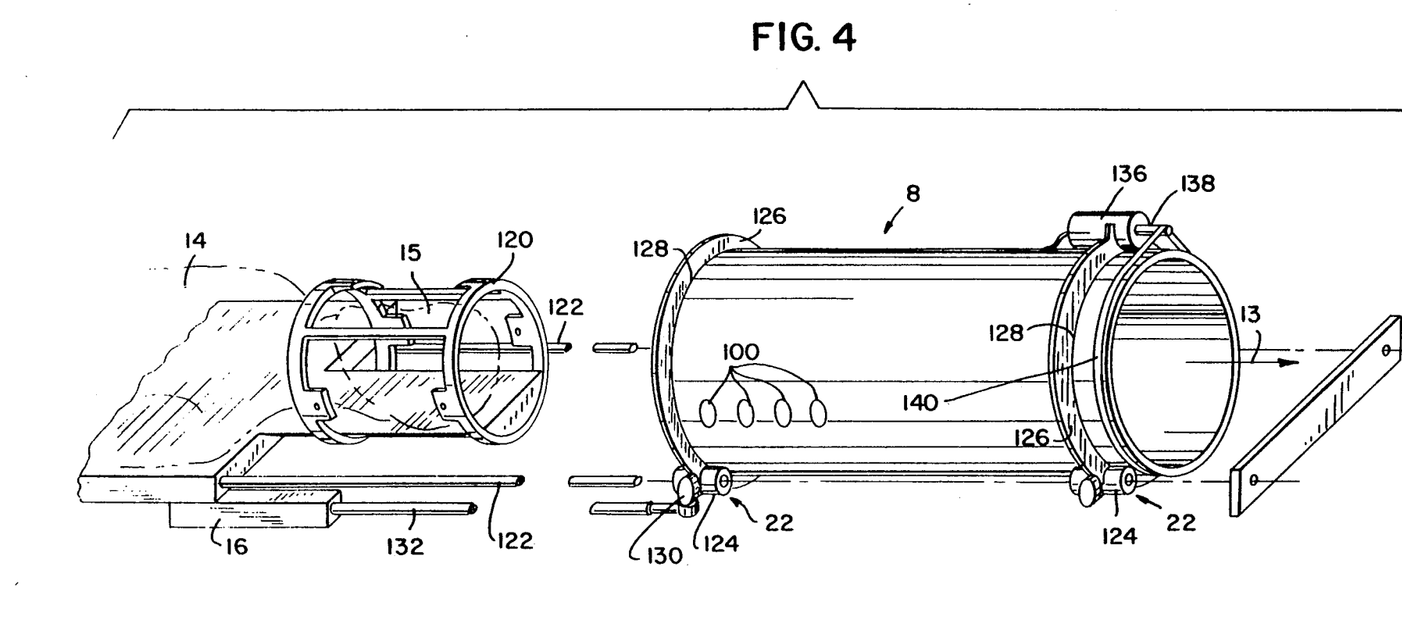
FIG. 4 is an exploded view of the combination of the stereotaxic frame and the local coil assembly showing the mounting for positioning the local coil assembly with respect to the stereotaxic frame.

Referring now to FIG. 4, when the patient 14 is supine on table 16, the patient's head 15 rests within a stereotaxic frame 120, such as is known in the art, for restraining the patient's head 15 from movement with respect to the frame 120. The frame 120 is rigidly affixed to the table 16 so that positioning the table 16 exactly determines the position of the patient's head 15 within the bore 12 of the MRI magnet assembly 10.

The local coil assembly 8 is also attached to the table 16 and may be positioned with respect to the stereotaxic frame 120 by means of rod ways 122 extending parallel to the z-axis 13 from the left and right superior side of the table 16. These rod ways 122 are received by linear bearings 124 attached to collars 126 which fit over the inferior and superior ends of the local coil assembly 8. The collars 126 include bearings 128 permitting the local coil assembly 8 to rotate about the z-axis 13 with respect to the linear bearings 124. Thus, the local coil assembly 8 may move transversely along the z-axis 13 and rotate about the z-axis 13 with respect to the patient's head 15.

The linear bearings 124 include locking screws 130 which permit the local coil assembly 8 to be locked in a fixed position with respect to movement along z-axis 13. The particular position may be determined by means of a linear digital encoder 132 having one end attached to the table 16 and the other attached to one linear bearing 124, the encoder 132 providing a signal to either a nearby readout (not shown) or to the computer 48 (shown in FIG. 2).

A rotary encoder 136 is mounted on the superior collar 126 to be rotatively fixed with respect to the patient's head 15 and has its shaft 138 connected to the local coil assembly 8 by means of a belt 140. Rotation of the local coil assembly 8 rotates the shaft 138 thereby providing an indication, through rotary encoder 136, of the angular position of the gradient coil assembly 8 with respect to the patient's head 15.

Referring momentarily also to FIG. 2, the angle signal from the rotary encoder 136 is routed to the pulse control module 42 which controls the gradients $G_x$, $G_y$, and $G_z$, this signal being employed so as to rotate the effective axes of the gradients with respect to the local coil assembly 8, to preserve their alignment with respect to the patient 14 and thus to compensate for rotation of the local coil assembly 8. Specifically, if $\phi$ is the angle rotation of the local coil assembly 8 from its normal position, i.e. where the gradient $G_x$ is horizontal and the $G_y$ is vertical, then pulse control module 42 modifies the gradients $G_x$ and $G_y$ to produce new gradients $G_x{'}$ and $G_y{'}$ where:

$$G_x{'} = \cos(\phi)G_x - \sin(\phi)G_y \quad (2)$$

$$G_y{'} = \cos(\phi)G_y + \sin(\phi)G_x \quad (3)$$

Thus, despite rotation of the local coil assembly 8, the effective gradients used to image the patient's head 15 will remain unrotated. However, even though the image of the patient's head 15 will remain unrotated, with rotation of the local coil assembly 8 causes the ports 100 in the local coil assembly 8 (being aligned with ports 83, 88 and 72) to rotate about the patient's head 15 providing unrestricted angular axis to the patient's head 15.

This angular rotation plus translation of the local coil assembly 8, with respect to the patient's head 15, ensures that at least one port 100 can be positioned so as to allow the necessary access for stereotaxic instruments. And because only a few ports 100 now suffice to provide access to the entire area of the patient's head 15, the disruption of the gradient fields $G_x$ and $G_y$ by the ports 100 is minimized.

As mentioned briefly above, the placement and path of the loops 108 of the spiral coils 102 and 103, near the ports 100, are adjusted to minimize the effect of the ports 100 on the gradient fields $G_x$ and $G_y$. As an initial matter, the size and location of the ports 100 is selected so as not to sever any one of the loops 108. Further, however, the loops 108 adjacent to the ports 100 are diverted about the ports 100 in a manner to minimize disruption of the magnetic field gradients $G_x$ and $G_y$.

The character of the gradient produced by a spiral coil 102 or 103 is determined by a stream function $S(z,\theta)$ defined over the surface of the spiral coil for cylindrical coordinates: z along the z-axis 13, and angles $\theta$ about the z-axis 13 when spiral coil 102 or 103 is fitted over the third tubular form 98. The stream function S will be known for the spiral coil 102 or 103 without ports 100, as determined during its design or may be deduced from the coil geometry as will be apparent from the following description. U.S. Pat. No. 4,840,700, issued Jun. 20, 1989 to the assignee of the present invention and hereby incorporated by reference, discusses one method of designing spiral coils using the stream function S as related to a desired gradient.

Knowing the stream function S, the placement of the loops 108 may be deduced from the vector function of current density J as determined by the following formula:

$$J(z, \theta) = \frac{\partial S}{\partial z} i_\theta - \frac{1}{r_c} \frac{\partial S}{\partial \theta} i_z \quad (4)$$

where J is the current density over the spiral coil 102 or 103 comprising a vector of direction and magnitude for each point over the surface of the spiral coil, and defined in the cylindrical coordinates of z and $\theta$; $r_c$ is the radius of the tubular form 98; and $i_\theta$ and $i_z$ are unit vectors oriented along the respective axes. The current density J determines the number and direction of the loops 108, and the current through the loops 108, as is needed at each point of the surface coil 102 or 103 to produce the gradient corresponding to the given stream function S.

The geometry of the loops 108 of the spiral coil 102 or 103 may be determined by integrating J over small areas of the surface coil 102 or 103. The magnitude of this integral determines the total number of loops 108 needed in that area and the argument of the integral determines the direction of the loops 108 at that area.

As a result of the close relationship between the stream function S and the magnetic gradient field $G_x$ or $G_y$, it is desirable that the ports 100 through the spiral coil 102 or 103 are designed to minimize the disruption of the stream function S.

Referring to FIG. 6(a), a region 142 in which a port 100 might be placed is defined by a circle of radius $r_1$ on the surface of the spiral coil 102. A transition region 143 around the port placement region 142 has a radius of $r_2$. The value of $r_2$ is generally three or more times $r_1$ to provide a gradual transition region; $r_2$ could be the entire coil 102.

Prior to the placement of the port 100 in region 142, a given current density $J_{coil}$ will exist within region 144 determined by the currents traveling along paths 146 which may, for example, each be loops 108 of the coil 102. It will be understood that with the placement of the port 100 in region 142, as shown in FIG. 6(b), that the value of the current density J within region 142 will be zero, no current may flow across the opening of the port 100 in region 142 along paths 146. Hence, by equation (4) the value of the stream function S in region 142, will be constant.

This flattening of the stream function S at the region 142 is an unavoidable result of creating a port 100 in region 142.

It has been determined that the disruption of the gradient fields $G_x$ and $G_y$, given this necessary distortion of the stream function S, is minimized by reducing the abruptness of the transition of values of S between regions 142 and region 144 in region 143. A transition is accomplished by "feathering" the disruption in the stream function S produced by the port 100, by a weighting function f in region 144. Specifically, a new stream function $S_{new}$ is defined as follows:

(1) For region 142, the stream function $S_{new}$ is set equal to $S_0$, $S_0$ being the value of $S_{coil}$ at the center of the port and where $S_{coil}$ is the designed stream function S prior to insertion of port 100.

(2) For region 143, the transition region: $S_{new}$ is weighted by the function f as follows:

$$S_{new} = (f)S_{coil} + (1-f)S_0 \quad (5)$$

or, for the case of a linear weighting:

$$S_{new} = \frac{r - r_1}{r_2 - r_1} S_{coil} + \frac{r_2 - r}{r_2 - r_1} S_0 \quad (5')$$

where r is a radius measured from the center of the region 142.

(3) For region 144, outside of the transition region, $S_{new}$ is simply equal to $S_{coil}$, the stream function S prior to insertion of port 100.

Thus, the values of S within the port region 142 are smoothly blended in the transition region 143 with the values of S outside of the region 142.

From this revised stream function $S_{new}$, (per equation 5') new current density values $J_{new}$ may be computed according to the following equation:

$$J_{\theta, new} = \frac{r - r_1}{r_2 - r_1} J_{\theta, coil} + \frac{S_{coil} - S_0}{(r_2 - r_1)r} [(z - z_0)i_\theta] \quad (6)$$

$$J_{z, new} = \frac{r - r_1}{r_2 - r_1} J_{z, coil} - \frac{S_{coil} - S_0}{(r_2 - r_1)r} [(r_c\theta - r_c\theta_0)i_z] \quad (7)$$

as derived from equation (4) above where:

$$r = \sqrt{(z - z_0)^2 + (r_c\theta - r_c\theta_0)^2}$$

with $z_0$ and $\theta_0$ being the coordinates of the center of the port 100; and in which $J_{coil}$ (having components $J_{\theta,coil}$ and $J_{z,coil}$) is a vector function of current density associated with $S_{coil}$.

A new coil pattern for spiral coils 102 may be computed from the current density values $J_\theta$ and $J_z$ of the above equations, according to methods well-known in the art and as described briefly above. The new spiral coil 102 incorporating the ports 100 will have loops 108 which flow around the ports 100 in much the same fashion as water flows around a rock in a stream. This diversion of the loops 108 around the ports 100 significantly reduces the disruption of the gradient field from the desired gradient.

It will be understood from the above discussion that the function f need not be linear, but may be, in general, any monotonically increasing function of the radius from the center of the port 100, including higher order polynomials.

Referring to FIG. 6(b), an intuitive understanding of the effect of diverting the current paths 146 around the port 100 can be understood by examining two example vectors of current flow 148 at a point at which the current paths 146 divert around the port 100. The horizontal components of these vectors 148 cancel for points removed from the port 100 where the difference between the distances from the vectors 148 and that point are small compared to the total distance, such conditions as will exist deep within the imaging volume. Under these conditions, the vertical components of vectors 148 will sum up to equal the previous undisturbed vector over the region.

The above described method of producing a port 100 in a spiral coil 102 is not limited to ports 100 for the insertion of stereotaxic instruments. Referring again to FIG. 5, openings formed by opposing notches 121 may be produced in the edge of spiral coil 102 to provide electrical connection to the underlying coil 103 as described above. The loops 108 may also be diverted around these notches 121 using the same technique as described above.

Generally, for distances close to the local gradient coil assembly 8 and hence close to ports 100, some distortion in the gradient fields will be present. The effect of these distortions may be minimized to the use of mathematical compensation techniques such as are known in the art and described in U.S. Pat. No. 4,591,789, issued May 27, 1986, assigned to the same assignee as the present invention and hereby incorporated by reference.

The above description has been that of a preferred embodiment of the present invention. It will occur to those who practice the art that many modifications may be made without departing from the spirit and scope of the invention. For example, it will be understood that the above technique also works for coils that are constructed out of conductive wire, rather than out of etched copper loops 108. Also, the number of ports 100 may be varied within the constraints described above.

In order to apprise the public of the various embodiments that may fall within the scope of the invention, the following claims are made.

We claim:

1. In an MRI system producing an image of an imaged object held within a bore, a local gradient coil assembly comprising:
    a coil form within the bore for defining a local imaging volume immediate to the image object, and having a first port therein for the insertion of a stereotaxic device into a portion of the local imaging volume;
    an alignment means having a locked and unlocked mode for holding the imaged object, in the local imaging volume, in a fixed position with respect to the coil form when the alignment means is in the locked mode;
    a gradient coil having windings affixed to the coil form for imposing a predetermined magnetic gradient within the local imaging volume, and having a second port corresponding in position to the first port;
    wherein the coil form includes a bearing means for moving the coil form and gradient coil and first and second ports with respect to the imaged object when the alignment means is in the unlocked mode to change the portion of the imaging volume over which the first and second ports are positioned and, the bearing means also permitting rotation of coil form and gradient coils and first and second ports with respect to the imaged object when the alignment means is in the unlocked condition;
    a pulse control module connected to the gradient coil generating a gradient signal received by the gradient coil;
    an encoder in communication with the bearing means for providing an angle signal indicative of the rotation of the coil form with respect to the alignment means; and
    wherein the angle signal is received by the pulse control module for controlling the gradient signal to correct for rotation of the coil form.

2. In an MRI system producing an image of an imaged object held within a bore, a local gradient coil assembly comprising:
    a coil form within the bore for defining a local imaging volume immediate to the imaged object, and having a first port therein for the insertion of a stereotaxic device into a portion of the local imaging volume;
    an alignment means having a locked and unlocked mode for holding the imaged object, in the local imaging volume, in a fixed position with respect to the coil form when the alignment means is in the locked mode;
    a gradient coil having windings affixed to the coil form for imposing a predetermined magnetic gradient within the local imaging volume, and having a second port corresponding in position to the first port, the windings near the second port diverted around the second port so as to minimize the disruption of a stream function of the gradient coil and compensate for the disruption in a gradient produced by the second port, the windings being cylindrical with radius $r_c$, defined in cylindrical coordinates $Z$ and $\theta$, and being diverted to conform to a vector function of current density $J_{new}$ where;

$$J_{\theta,\,new} = \frac{r - r_1}{r_2 - r_1} J_{\theta,\,coil} + \frac{S_{coil} - S_0}{(r_2 - r_1)r}[(z - z_0)i_\theta]$$

-continued $$J_{z, new} = \frac{r - r_1}{r_2 - r_1} J_{z, coil} - \frac{S_{coil} - S_0}{(r_2 - r_1)r} [(r_c\theta - r_c\theta_0)i_z]$$

in which $$r = \sqrt{(z - z_0)^2 + (r_c\theta - r_c\theta_0)^2)}$$

with $Z_0$ and $\theta_0$ being the coordinates of the center of the second port; and in which
$r_1$ is the radius of the second port;
$r_2$ is the radius of a predetermined transition region;
$S_{coil}$ is a desired stream function for the gradient coil and $S_0$ is the value of $S_{coil}$ at the center of the port;
$J_{coil}$ is a vector function of current density associated with $S_{coil}$; and
wherein the coil form includes a bearing means for moving the coil form and gradient col and first and second ports with respect to the imaged object when the alignment means is in the unlocked mode to change the portion of the imaging volume over which the first and second ports are positioned.

3. In an MRI system producing an image of an imaged object held within a bore, a local gradient coil assembly comprising: 'a coil form within the bore for defining a local imaging volume immediate to the image object, and having a first port therein for the insertion of a stereotaxic device into a portion of the local imaging volume;
  an alignment means having a locked and unlocked mode for holding the imaged object, in the local imaging volume, in a fixed position with respect to the coil form when the alignment means is in the locked mode;
  a gradient coil having windings affixed to the coil form for imposing a predetermined magnetic gradient within the local imaging volume, and having a second port corresponding in position to the first port, an RF coil having conductors affixed to the coil form for generating a radio frequency magnetic field within the local imaging volume and an RF shield interposed between the RF coil and the gradient coil attached to the coil form and having an aperture corresponding to the first and second ports for admitting the stereotaxic device; and
  wherein the coil form includes a bearing means for moving the coil form and gradient coil and first and second ports with respect to the imaged object when the alignment means is in the unlocked mode to change the portion of the imaging volume over which the first and second ports are positioned.

4. In an MRI system producing an image of an imaged object held within the bore, a local gradient coil assembly comprising;
  a coil form within the bore for defining a local imaging volume immediate to the imaged object the coil form having a plurality of first ports therein, spaced along an axis by a separation distance, to permit the insertion of a surgical instrument;
  an alignment means for holding the imaged object in the local imaging volume in a predetermined position with respect to the coil form;
  a gradient coil having windings affixed to the coil form for imposing a predetermined magnetic gradient along a first axis, and having a plurality of second ports corresponding in position to the plurality of first ports, the windings being diverted around the second ports to compensate for the disruption in the gradient produced by the second ports, the windings being cylindrical with radius $r_c$, defined in cylindrical coordinates $Z$ and $\theta$, and being diverted to conform to a vector function of current density $J_{new}$ where:

$$J_{\theta, new} = \frac{r - r_1}{r_2 - r_1} J_{\theta, coil} + \frac{S_{coil} - S_0}{(r_2 - r_1)r} [(z - z_0)i_\theta]$$

$$J_{z, new} = \frac{r - r_1}{r_2 - r_1} J_{z, coil} - \frac{S_{coil} - S_0}{(r_2 - r_1)r} [(r_c\theta - r_c\theta_0)i_z]$$

in which $$r = \sqrt{(z - z_0)^2 + (r_c\theta - r_c\theta_0)^2)}$$

with $Z_0$ and $\theta_0$ being the coordinates of the center of the second port; and in which
$r_1$ is the radius of the second port;
$r_2$ is the radius of a predetermined transition region;
$S_{coil}$ is a desired stream function for the gradient coil and $S_0$ is the value of $S_{coil}$ at the center of the port; and
$J_{coil}$ is a vector function of current density associated with $S_{coil}$; and
a translation means for translating the coil form with respect to the alignment means along the axis by at least the separation distance.

* * * * *